United States Patent
Jung

(10) Patent No.: US 12,484,391 B2
(45) Date of Patent: Nov. 25, 2025

(54) DISPLAY DEVICE

(71) Applicant: LG Display Co., Ltd., Seoul (KR)

(72) Inventor: Hwajun Jung, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/517,989

(22) Filed: Nov. 22, 2023

(65) Prior Publication Data

US 2024/0224630 A1  Jul. 4, 2024

(30) Foreign Application Priority Data

Dec. 30, 2022 (KR) .................. 10-2022-0191161

(51) Int. Cl.
*G09G 3/3233* (2016.01)
*H10K 59/126* (2023.01)
*H10K 59/131* (2023.01)

(52) U.S. Cl.
CPC ......... *H10K 59/126* (2023.02); *G09G 3/3233* (2013.01); *H10K 59/131* (2023.02); *G09G 2300/0842* (2013.01); *G09G 2320/0219* (2013.01); *G09G 2320/0233* (2013.01)

(58) Field of Classification Search
CPC .............. H10K 59/126; H10K 59/131; H10K 59/1213; H10K 59/1216; H10K 59/124; G09G 3/3233; G09G 2300/0842; G09G 2320/0219; G09G 2320/0233
See application file for complete search history.

(56) References Cited

U.S. PATENT DOCUMENTS

| 11,271,181 | B1* | 3/2022 | Yang | G09G 3/2092 |
| 2016/0190166 | A1* | 6/2016 | Kim | H10D 86/481 257/71 |
| 2018/0004329 | A1* | 1/2018 | So | G09G 3/20 |
| 2019/0088198 | A1* | 3/2019 | Kang | G09G 3/3233 |
| 2020/0212356 | A1* | 7/2020 | Kim | H10K 59/124 |
| 2020/0226978 | A1* | 7/2020 | Lin | H10K 59/1213 |
| 2021/0175311 | A1* | 6/2021 | Kwak | H10D 86/60 |
| 2021/0375215 | A1* | 12/2021 | Cho | H10D 86/60 |
| 2022/0208110 | A1* | 6/2022 | Yu | G09G 3/3291 |
| 2022/0352287 | A1* | 11/2022 | Liao | G09G 3/3258 |
| 2023/0351956 | A1* | 11/2023 | Liu | G09G 3/3241 |
| 2023/0368730 | A1* | 11/2023 | Yamamoto | G09G 3/3233 |
| 2024/0021121 | A1* | 1/2024 | Tian | G09G 3/3266 |
| 2024/0078952 | A1* | 3/2024 | Choi | G09G 3/3233 |
| 2024/0194127 | A1* | 6/2024 | Jeon | G09G 3/32 |

FOREIGN PATENT DOCUMENTS

KR 10-2018-0074164 A 7/2018

* cited by examiner

*Primary Examiner* — Jose R Soto Lopez
(74) *Attorney, Agent, or Firm* — Birch, Stewart, Kolasch & Birch, LLP

(57) ABSTRACT

A display device can include a substrate including an active area including a plurality of sub-pixels and a non-active area, a plurality of light-emitting elements disposed in the plurality of sub-pixels, a plurality of data lines disposed in the active area, a plurality of data link lines disposed in the active area and configured to transmit a data voltage to the plurality of data lines, driving transistors disposed in the plurality of sub-pixels, and a shielding layer disposed on the driving transistors to overlap a conductive layer connected to a source electrode of one of the driving transistors. A constant voltage can be applied to the shielding layer and thus, the occurrence of screen spots can be reduced in the display device.

14 Claims, 8 Drawing Sheets

DISPLAY DEVICE

CROSS-REFERENCE TO RELATED APPLICATIONS

This application claims the priority benefit of Korean Patent Application No. 10-2022-0191161 filed on Dec. 30, 2022, in the Republic of Korea, the entire contents of which are hereby expressly incorporated by reference into the present application.

BACKGROUND

Technical Field

The present disclosure relates to a display device, and more particularly, to a display device in which screen spots due to a parasitic capacitance are reduced.

Discussion of the Related Art

Display devices used in computer monitors, TVs, and mobile phones include organic light-emitting displays (OLEDs) that emit light by themselves, and liquid crystal displays (LCDs) that require a separate light source.

Display devices are being applied to more and more various fields of application including not only computer monitors and TVs, but also personal mobile devices. Thus, display devices having a reduced volume and weight while having a wide active area are being studied.

Meanwhile, a printed circuit board bonded to a substrate is disposed on one side of the display device. An area in which the printed circuit board is disposed is an area in which actual images are not displayed, and when the printed circuit board is disposed on a front surface of the display device, a bezel is needed to cover the area. Accordingly, to minimize such a bezel area, a technique of bending one side of a substrate on which the printed circuit board is disposed toward a rear surface of the substrate has been developed.

The description provided in the discussion of the related art section should not be assumed to be prior art merely because it is mentioned in or associated with the discussion of the related art section. The discussion of the related art section can include information that describes one or more aspects of the subject technology, and the discussion in this section does not limit the invention.

SUMMARY OF THE DISCLOSURE

The inventor has recognized needs described above and other limitations associated with the related art. Accordingly, an aspect of the present disclosure is to provide a display device having a reduced bezel area by disposing link lines in an active area.

Another aspect of the present disclosure is to provide a display device in which a parasitic capacitance generated between a link line and a driving transistor in an active area of the display device is reduced.

Still another aspect of the present disclosure is to provide a display device in which screen spots generated in an area in which link lines are disposed are reduced.

Objects of the present disclosure are not limited to the above-mentioned objects, and other objects, which are not mentioned above, can be clearly understood by those skilled in the art from the following descriptions.

According to an aspect of the present disclosure, there is provided a display device. The display device comprises a substrate including an active area including a plurality of sub-pixels and a non-active area, a plurality of light-emitting elements disposed in the plurality of sub-pixels, a plurality of data lines disposed in the active area, a plurality of data link lines disposed in the active area and transmitting a data voltage to the plurality of data lines, driving transistors disposed in the plurality of sub-pixels, and a shielding layer disposed over the driving transistors to overlap a conductive layer connected to a source electrode of one of the driving transistors, wherein a constant voltage is applied to the shielding layer. Therefore, the occurrence of screen spots can be reduced in the display device.

Other detailed matters of the exemplary embodiments of the present disclosure are included in the detailed description and the drawings.

According to one or more embodiments of the present disclosure, a bezel area can be reduced by disposing a link line positioned between the bending area and an active area in the active area.

According to one or more embodiments of the present disclosure, a parasitic capacitance generated in a driving transistor can be shielded.

According to one or more embodiments of the present disclosure, reliability of a display device can be improved by reducing a luminance deviation that can occur due to a change in voltage of a link line disposed in an active area.

The effects according to the present disclosure are not limited to the contents exemplified above, and more various effects are included in the present specification.

BRIEF DESCRIPTION OF THE DRAWINGS

The above and other objects, features and other advantages of the present disclosure will be more clearly understood from the following detailed description taken in conjunction with the accompanying drawings, in which.

Figure 1:
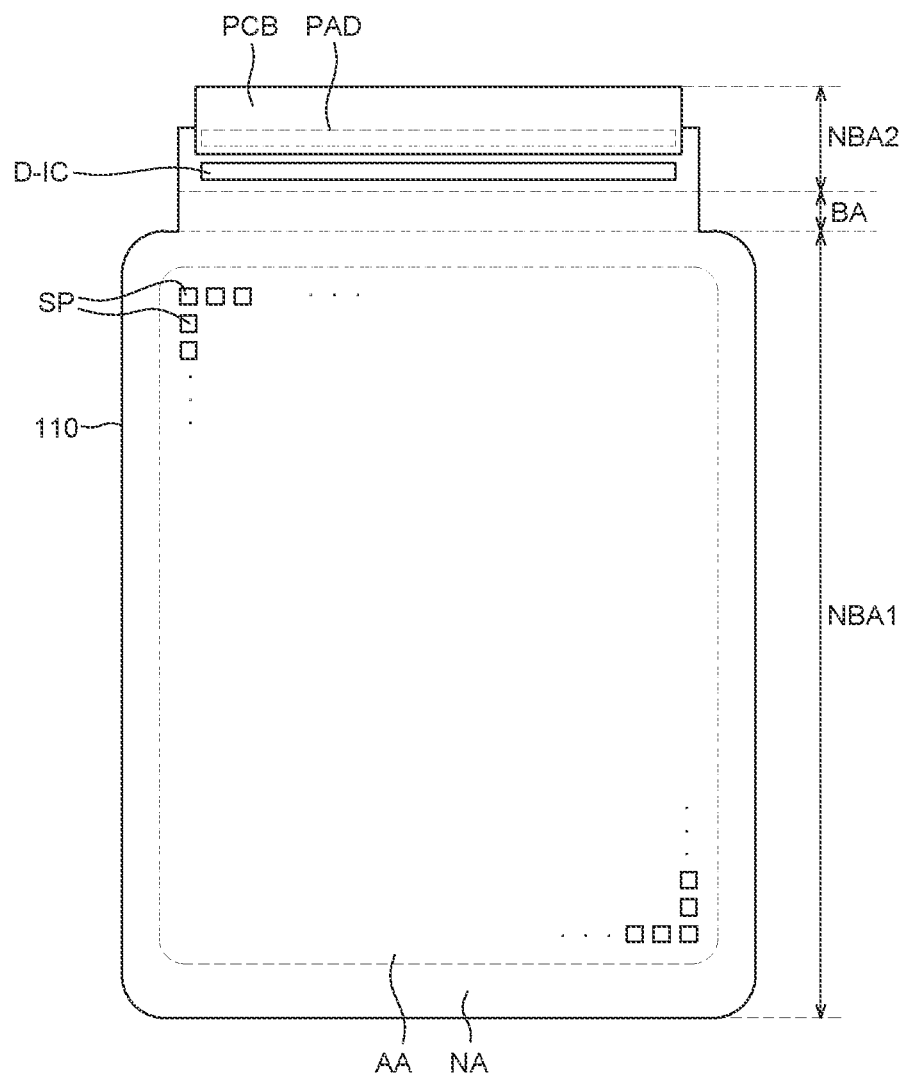
FIG. 1 is a plan view of a display device according to an exemplary embodiment of the present disclosure.

Throughout the drawings and the detailed description, unless otherwise described, the same drawing reference numerals should be understood to refer to the same elements, features, and structures. The relative size and depiction of these elements can be exaggerated for clarity, illustration, and convenience.

DETAILED DESCRIPTION OF THE EMBODIMENTS

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Further, the present disclosure is only defined by the scope of the claims and their equivalents.

The shapes, sizes, areas, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "include," "have," "comprise," "contain," "constitute," "make up of," "formed of," and "consist of" used herein are generally intended to allow other components to be added unless the terms are used with the term such as "only". Any references to singular can include plural unless expressly stated otherwise.

Components are interpreted to include an ordinary error range or an ordinary tolerance range even if not expressly stated.

When the position relation between two parts is described using the terms such as "on", "above", "over", "below", "under", "beside", "beneath", "near", "close to," "adjacent to", "on a side of", "next" or the like, one or more parts can be positioned between the two parts unless the terms are used with the term such as "immediately" or "directly".

When an element or layer is disposed "on" another element or layer, additional layer(s) or element(s) can be interposed directly on the other element or therebetween.

Spatially relative terms, such as "under," "below," "beneath", "lower," "over," "upper" and the like, can be used herein for ease of description to describe one element or feature's relationship to another element(s) or feature(s) as illustrated in the figures. It will be understood that the spatially relative terms can encompass different orientations of an element in use or operation in addition to the orientation depicted in the figures. For example, if an element in the figures is inverted, elements described as "below" or "beneath" other elements or features would then be oriented "over" the other elements or features. Thus, the exemplary term "below" can encompass both an orientation of below and above. Similarly, the exemplary term "above" or "over" can encompass both an orientation of "above" and "below".

In describing temporal relationship, terms such as "after," "subsequent to," "following," "next," "before," and the like can include cases where any two events are not consecutive, unless the term such as "immediately" "just" or "directly" is explicitly used.

Although the terms "first", "second", "A", "B", "(a)", "(b)" and the like are used for describing various components, these components are not confined by these terms. These terms are merely used for distinguishing one component from the other components. Therefore, a first component to be mentioned below can be a second component in a technical concept of the present disclosure.

In addition, terms, such as first, second, A, B, (a), (b), or the like can be used herein when describing components of the present disclosure. Each of these terminologies is not used to define an essence, order, or sequence of a corresponding component but used merely to distinguish the corresponding component from other components. In the case that it is described that a certain structural element or layer is "connected", "coupled", "adhered" or "joined" to another structural element or layer, it is typically interpreted that another structural element or layer can be "connected", "coupled", "adhered" or "joined" to the structural element or layer directly or indirectly.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

A term "device" used herein can refer to a display device including a display panel and a driver for driving the display panel. Examples of the display device can include an organic light emitting diode (OLED), and the like. In addition, examples of the device can include a notebook computer, a television, a computer monitor, an automotive device, a wearable device, and an automotive equipment device, and a set electronic device (or apparatus) or a set device (or apparatus), for example, a mobile electronic device such as a smartphone or an electronic pad, which are complete products or final products respectively including OLED and the like, but embodiments of the present disclosure are not limited thereto.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein.

In the aspects of the present disclosure, a source electrode and a drain electrode are distinguished from each other, for convenience of description. However, the source electrode and the drain electrode are used interchangeably. The source electrode can be the drain electrode, and the drain electrode can be the source electrode. Also, the source electrode in any one aspect of the present disclosure can be the drain electrode in another aspect of the present disclosure, and the drain electrode in any one aspect of the present disclosure can be the source electrode in another aspect of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a schematic plan view of a display device according to an exemplary embodiment of the present disclosure. All the components of each display device according to all embodiments of the present disclosure are operatively coupled and configured. In FIG. 1, a substrate 110, a pad part PAD, a driver integrated circuit D-IC, a printed circuit board PCB, and a plurality of sub-pixels SP are illustrated for convenience of description, but the present disclosure is not limited thereto.

Referring to FIG. 1, a display device 100 can include the substrate 110, the pad part PAD, a gate driver, the driver integrated circuit D-IC, and the printed circuit board PCB.

An active area AA and a non-active area NA surrounding the active area AA or in the vicinity of the active area AA can be defined on the substrate 110. The active area AA is an area in which an image is actually displayed in the display device 100, and light-emitting elements, which will be described later, and various driving elements for driving the light-emitting elements can be disposed in the active area AA. The non-active area NA is an area in which an image is not displayed and can be defined as an area surrounding the active area AA or in the vicinity of the active area AA. Various elements for driving the plurality of sub-pixels SP disposed in the active area AA can be disposed in the non-active area NA.

Referring to FIG. 1, the substrate 110 can include a first non-bending area NBA1, a bending area BA extending and bent from one side of the active area AA, and a second non-bending area NBA2 extending from one side of the bending area BA and including the non-active area NA. The substrate 110 can include glass, plastic, or a flexible polymer film. For example, the flexible polymer film can be made of any one of polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF), cyclic olefin copolymer (COC), triacetylcellulose (TAC) film, polyvinyl alcohol (PVA) film, and polystyrene (PS), and the present disclosure is not limited thereto.

The first non-bending area NBA1 is an area that corresponds to the active area AA where the plurality of sub-pixels SP are disposed, and maintains a flat state. The second non-bending area NBA2 is an area opposite to the first non-bending area NBA1, and is an area where circuit elements such as the printed circuit board PCB connected to the pad part PAD and the driver integrated circuit D-IC are disposed and that maintains a flat state.

The bending area BA is an area that maintains a bent state. Meanwhile, notches formed by cutting both edges of the substrate 110 in the bending area BA of the substrate 110 can be disposed. For example, notches can be formed by cutting both side surfaces of the substrate 110 in a process of cutting a mother substrate into a unit of panels. Accordingly, an area of the substrate 110 disposed in the bending area BA can be relatively reduced, so that stress applied to the substrate 110 can be reduced. Meanwhile, in order to prevent propagation of cracks that can occur during the cutting process, a crack prevention structure can be disposed inside the substrate 110 along the cutting surface including the notches.

The pad part PAD is disposed in the second non-bending area NBA2. The pad part PAD can be electrically connected to the printed circuit board PCB to receive external power and data driving signals or to exchange touch signals. Accordingly, various driving signals such as driving signals and data voltages can be supplied to the driver integrated circuit D-IC through the pad part PAD.

The driver integrated circuit D-IC can be disposed in the second non-bending area NBA2. The driver integrated circuit D-IC can provide data signals to the plurality of sub-pixels SP. For example, the driver integrated circuit D-IC can sample and latch a data signal supplied from a timing controller in response to a data timing control signal supplied from the timing controller, convert the data signal into a gamma reference voltage, and output it. The driver integrated circuit D-IC can output the data signal through a plurality of data lines.

As the bending area BA is bent, the printed circuit board PCB connected to the pad part PAD and the driver integrated circuit D-IC can move to a rear side of the substrate 110 and overlap the first non-bending area NBA1. Accordingly, circuit elements such as the printed circuit board PCB connected to the pad part PAD, and the driver integrated circuit D-IC may not be visually recognized when viewed from above the substrate 110. In addition, as the bending area BA is bent, a size of the non-active area NA visually recognized from above the substrate 110 is reduced, so that a narrow bezel can be realized.

The gate driver can be disposed in the non-active area NA of the first non-bending area NBA1. The gate driver can be disposed on at least one side surface of the active area AA and outputs gate signals and emission control signals under a control of the timing controller, and can select the sub-pixel SP that is charged with a data voltage through lines such as a gate line and an emission control signal line, and adjust an emission timing. The gate driver can shift scan signals and the emission control signals using a shift register and sequentially supply the gate signals and the emission control signals. The gate driver can be directly formed on the substrate 110 by a gate-driver in panel (GIP) method, but is not limited thereto. For example, the gate driver can be connected to the substrate 110 in a tape automated bonding (TAB) type, or connected to the substrate 110 in a chip on glass (COG) type or a chip on panel (COP) type, or connected to the substrate 110 in a chip on film (COF) type.

A plurality of high potential power supply lines can be disposed in the first non-bending area NBA1. The high potential power supply line is a line that transmits a high potential power supply voltage to each of the plurality of sub-pixels SP. The high potential power supply lines can include a first high potential power supply line, a second high potential power supply line disposed on the first high potential power supply line, and a third high potential power supply line disposed on the second high potential power supply line.

The plurality of data lines connected to the driver integrated circuit D-IC and extending to the bending area BA and the first non-bending area NBA1 can be disposed. The plurality of data lines can transmit signals applied to the driver integrated circuit D-IC to the sub-pixels SP disposed in the active area AA.

A plurality of gate link lines connecting the driver integrated circuit D-IC and the gate driver can be disposed in the first non-bending area NBA1. The gate link line can transfer external power from the pad part PAD to the gate driver disposed in the first non-bending area NBA1. Hereinafter, a detailed description of the plurality of data lines will be referred with FIG. 2.

Figure 2:
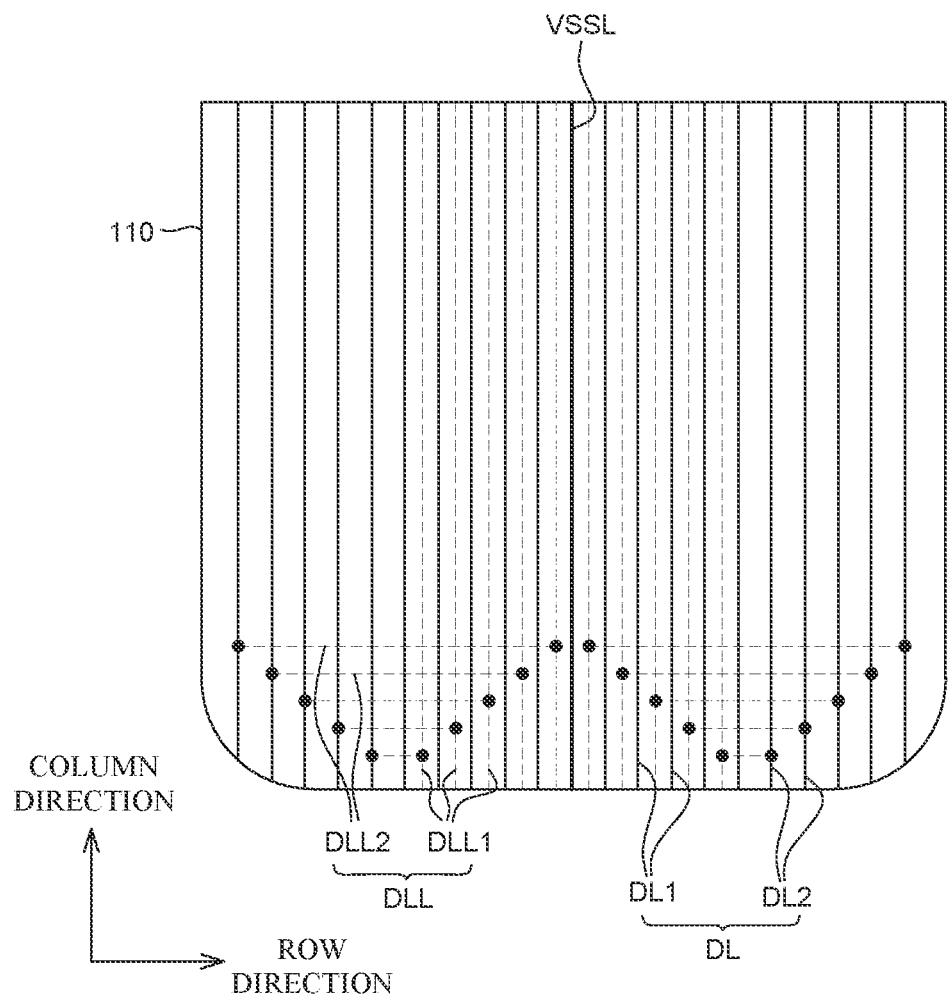
FIG. 2 is a schematic plan view of an active area of the display device according to an exemplary embodiment of the present disclosure.

FIG. 2 is a schematic plan view of an active area of the display device according to an exemplary embodiment of the present disclosure. In FIG. 2, the substrate 110, a low potential power supply line VSSL, and a plurality of data lines DL among various components of the display device 100 are illustrated for convenience of description, but the present disclosure is not limited thereto.

Referring to FIG. 2, the low potential power supply line VSSL is disposed on the substrate 110. The low potential power supply line VSSL can be electrically connected to cathodes of the light-emitting elements of the plurality of sub-pixels SP. The low potential power supply line VSSL can be disposed to extend in a column direction in the active area AA. For example, the low potential power supply line VSSL can be disposed between first data lines DL1 and first portions DLL1 at a central portion of the substrate 110. Meanwhile, a low potential power supply link line connected to the low potential power supply line VSSL can be disposed. The low potential power supply link line can be disposed in a row direction in the active area AA and electrically connected to the cathodes of the light-emitting elements of the plurality of sub-pixels SP, but the present disclosure is not limited thereto.

Referring to FIG. 2, the plurality of data lines DL include a plurality of first data lines DL1, a plurality of second data lines DL2, and a plurality of data link lines DLL.

The plurality of first data lines DL1 can be disposed in the form of straight lines between the driver integrated circuit D-IC and the active area AA. Accordingly, the plurality of first data lines DL1 can be disposed in an area corresponding to a width of the driver integrated circuit D-IC (e.g., extended in column direction). For example, when the driver integrated circuit D-IC is disposed in the central portion of the substrate 110, the plurality of first data lines DL1 are disposed in the central portion of the substrate 110 and may not be disposed in an outer portion of the substrate 110.

The plurality of first data lines DL1 can be connected to the plurality of sub-pixels SP without separate link lines. For example, the plurality of first data lines DL1 can extend from the driver integrated circuit D-IC and be directly connected to the plurality of sub-pixels SP.

The plurality of second data lines DL2 are disposed outside the plurality of first data lines DL1. For example, when the plurality of first data lines DL1 are disposed in the central portion of the substrate 110, the plurality of second data lines DL2 can be disposed in the outer portion of the substrate 110.

The plurality of second data lines DL2 can be connected to the plurality of sub-pixels SP through the plurality of data link lines DLL. For example, the plurality of second data lines DL2 can be connected to the plurality of sub-pixels SP through the plurality of data link lines DLL extending from the driver integrated circuit D-IC. However, the embodiments of present disclosure are not limited thereto, the plurality of second data lines DL2 can be connected to the plurality of sub-pixels SP directly.

Referring to FIG. 2, the plurality of data link lines DLL are disposed in the active area AA. The plurality of data link lines DLL include the plurality of first portions DLL1 disposed between the plurality of first data lines DL1 and in a direction parallel with the plurality of data lines DL and the plurality of second portions DLL2 connected to the plurality of first portions DLL1 and disposed in a direction crossing the plurality of data lines DL.

The plurality of first portions DLL1 are disposed to extend from the driver integrated circuit D-IC. The plurality of first portions DLL1 can be disposed in the form of straight lines between the driver integrated circuit D-IC and the active area AA. For example, the plurality of first portions DLL1 can be disposed between the plurality of first data lines DL1 in an area corresponding to the width of the driver integrated circuit D-IC and extended in a direction parallel with the plurality of data lines DL. Accordingly, when the driver integrated circuit D-IC is disposed in the central portion of the substrate 110, the plurality of first portions DLL1 are disposed in the central portion of the substrate 110 and may not be disposed in the outer portion of the substrate 110.

The plurality of second portions DLL2 are disposed in a direction crossing the first data lines DL1, the second data lines DL2, and the plurality of first portions DLL1. The plurality of second portions DLL2 connect the plurality of second data lines DL2 and the plurality of first portions DLL1. Accordingly, signals applied from the driver integrated circuit D-IC can be transmitted to the second data lines DL2 through the plurality of first portions DLL1 and the plurality of second portions DLL2 disposed in the active area AA.

Accordingly, since the data link lines DLL are disposed within the active area AA, a bezel area of the display device 100 can be reduced. In the display device according to the related art, data link lines for connecting data lines disposed in the outer portion of the substrate among the plurality of data lines and the driver integrated circuit are disposed in the non-active area between the active area and the bending area. Accordingly, a reduction of the bezel area of the display device is limited, and difficulties are caused in implementing the display device with high resolution. On the other hand, in the display device 100 according to an exemplary embodiment of the present disclosure, the data link lines DLL for connecting the data lines DL disposed in the outer portion of the substrate 110 and the driver integrated circuit D-IC are disposed within the active area AA, so that the non-active area NA disposed between the active area AA and the bending area BA can be reduced, and the display device 100 with high resolution can be implemented.

Figure 3:
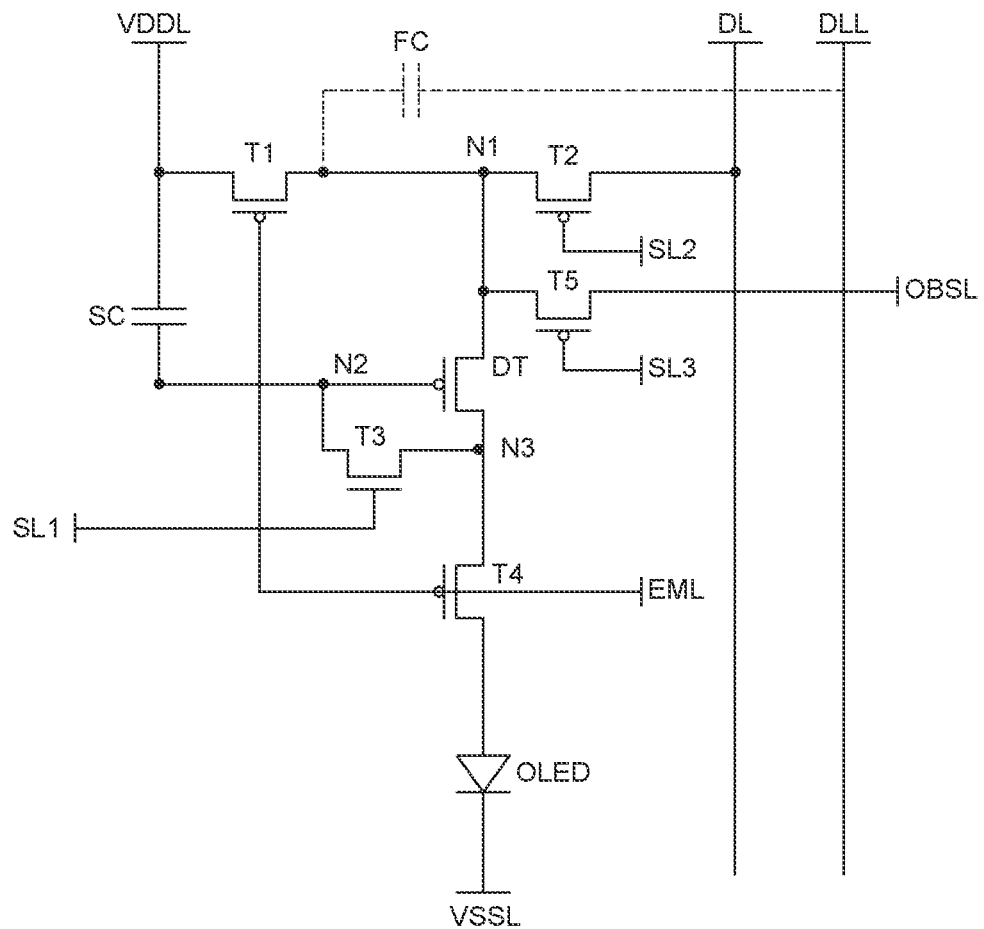
FIG. 3 is a circuit diagram of a sub-pixel of the display device according to an exemplary embodiment of the present disclosure.

FIG. 3 is a circuit diagram of a sub-pixel of the display device according to an exemplary embodiment of the present disclosure.

Referring to FIG. 3, driving circuits for driving light-emitting elements OLED of the plurality of sub-pixels SP each can include a first transistor T1, a second transistor T2, a driving transistor DT, a third transistor T3, a fourth transistor T4, a fifth transistor T5, and a storage capacitor SC. To drive the driving circuit, the display device includes a plurality of lines including a first scan line SL1, a second scan line SL2, an emission signal line EML, the data line DL, a high potential power supply line VDDL, a low potential power supply line VSSL, an on-bias stress line OBSL, and the data link line DLL, but the present disclosure is not limited thereto, and more or less transistors and capacitors could be included.

Each of the first transistor T1, the second transistor T2, the third transistor T3, the fourth transistor T4, the fifth transistor T5, and the driving transistor DT that are included in the driving circuit of the sub-pixel SP can include a gate electrode, a source electrode, and a drain electrode.

A portion of the plurality of transistors of the driving circuit of the sub-pixel SP can be implemented as P-type transistors, and the other thereof can be implemented as N-type transistors. For example, the first transistor T1, the second transistor T2, the fourth transistor T4, the fifth transistor T5, and the driving transistor DT can be implemented as P-type transistors, and the third transistor T3 can be implemented as an N-type transistor, but the present disclosure is not limited thereto. For example, all of the plurality of transistors of the driving circuit of the sub-pixel SP can be implemented as P-type transistors, or all of the plurality of transistors of the driving circuit of the sub-pixel SP can be implemented as N-type transistors. In the case of an N-type transistors, the gate-on voltage can be a gate-high voltage, and the gate-off voltage can be a gate-low voltage.

In the case of a P-type transistors, the gate-on voltage can be the gate-low voltage and the gate-off voltage can be the gate-high voltage.

The first transistor T1, the second transistor T2, the fourth transistor T4, the fifth transistor T5, and the driving transistor DT, which are P-type transistors, can be low-temperature polycrystalline silicon (LTPS) thin film transistors. The third transistor T3, which is an N-type transistor, can be an oxide thin film transistor.

The polycrystalline semiconductor thin film transistors TFT can have a faster movement speed of carriers such as electrons and holes. According to the embodiment of the present disclosure, the various thin transistors TFT such as the driving transistor DT can be manufactured using a polycrystalline semiconductor material such as low-temperature polycrystalline silicon (LTPS).

The oxide thin film transistor TFT can have an excellent effect of preventing a leakage current and relatively inexpensive manufacturing cost. According to the embodiment of the present disclosure, the oxide thin film transistor TFT such as third transistor T3 can be manufactured using an oxide semiconductor material.

The oxide semiconductors can be made of a metal oxide such as zinc (Zn), indium (In), gallium (Ga), tin (Sn), and titanium (Ti) or a combination of a metal such as zinc (Zn), indium (In), gallium (Ga), tin (Sn), or titanium (Ti) and its oxide. Specifically, the oxide semiconductor can include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium zinc oxide (IZO), indium gallium tin oxide (IGTO), and indium gallium oxide (IGO), but is not limited thereto.

In the P-type transistor, since holes flow from the source electrode to the drain electrode, current can flow from the source electrode to the drain electrode. In the N-type transistor, since electrons flow from the source electrode to the drain electrode, current can flow from the drain electrode to the source electrode.

The first transistor T1 can apply a high potential power supply voltage VDD to the first node N1 that is the source electrode of the driving transistor DT. The first transistor T1 can include a gate electrode connected to the emission signal line EML, a source electrode connected to the high potential power supply line VDDL, and a drain electrode connected to the first node N1. The first transistor T1 can apply the high potential power supply voltage VDD to the first node N1 that is the source electrode of the driving transistor DT, in response to an emission signal EM of a low level that is a turn-on level.

The storage capacitor SC can maintain data voltage Vdata stored in each of the sub-pixels SP during one frame. The storage capacitor SC can include a first electrode connected to a second node N2 and a second electrode connected to the high potential power supply line VDDL. For example, the first electrode of the storage capacitor SC can be connected to the gate electrode of the driving transistor DT, and the second electrode of the storage capacitor SC can be connected to the high potential power supply line VDDL.

The second transistor T2 can apply the data voltage Vdata supplied from the data line DL to the first node N1 that is the source electrode of the driving transistor DT. The second transistor T2 can include a gate electrode connected to the second scan line SL2, a source electrode connected to the data line DL, and a drain electrode connected to the first node N1 that is the drain electrode of the first transistor T1 and the drain electrode of the fifth transistor T5. The second transistor T2 can apply the data voltage Vdata supplied from the data line DL to the first node N1 that is the source electrode of the driving transistor DT, in response to a second scan signal Scan2 of a low level that is a turn-on level. For example, the second transistor T2 can function as a switch between the first node N1 and the data line DL under control of the second scan line SL2.

The driving transistor DT can control a driving current applied to the light-emitting element OLED according to a voltage Vsg between the source electrode and the gate electrode. The source electrode of the driving transistor DT can be connected to the first node N1, the gate electrode thereof can be connected to the second node N2, and the drain electrode thereof can be connected to a third node N3. Specifically, the source electrode of the driving transistor DT can be connected to the drain electrode of the first transistor T1, the drain electrode of the second transistor T2, and the drain electrode of the fifth transistor T5 at the first node N1. Also, the gate electrode of the driving transistor DT can be connected to the first electrode of the storage capacitor SC at the second node N2. Also, the drain electrode of the driving transistor DT can be connected to the drain electrode of the third transistor T3 and the source electrode of the fourth transistor T4 at the third node N3.

The third transistor T3 can diode-connect the gate electrode and the drain electrode of the driving transistor DT. The third transistor T3 can be an oxide thin film transistor that is an N-type transistor in order to reduce or minimize leakage current. The third transistor T3 can include a drain electrode connected to the third node N3, a source electrode connected to the second node N2, and a gate electrode connected to the first scan line SL1. Specifically, the gate electrode of the third transistor T3 can be connected to the first scan line SL1, the drain electrode of the third transistor T3 can be connected to the drain electrode of the driving transistor DT and the drain electrode of the fourth transistor T4, and the source electrode of the third transistor T3 can be connected to the first electrode of the storage capacitor SC and the gate electrode of the driving transistor DT.

The fourth transistor T4 can form a current path between the driving transistor DT and the light-emitting element OLED. The fourth transistor T4 can include a source electrode connected to the third node N3, a drain electrode connected to an anode of the light-emitting element OLED, and a gate electrode connected to the emission signal line EML. Specifically, the source electrode of the fourth transistor T4 can be connected to the drain electrode of the driving transistor DT and the drain electrode of the third transistor T3. For example, the fourth transistor T4 can function as a switch between the driving transistor DT and the light-emitting element OLED.

The fifth transistor T5 can transfer an on-bias stress OBS voltage to the first node N1. The fifth transistor T5 can include a gate electrode connected to a third scan line SL3, a source electrode connected to the on-bias stress line OBSL, and a drain electrode connected to the first node N1. Specifically, the drain electrode of the fifth transistor T5 can be connected to the source electrode of the driving transistor DT connected to the first node N1.

Meanwhile, the present disclosure is not limited to the circuit diagram of the pixel shown in FIG. 3 and various configurations of internal compensation circuits are possible. For example, a number of TFTs in the pixel circuit of the present disclosure can be three or more, and a number of storage capacitor SC can be one or more, for example, the pixel circuit of the present disclosure also can be a 3T1C pixel circuit including three TFTs and one storage capacitor SC, a 3T2C pixel circuit including three TFTs and two storage capacitors SCs, a 5T1C pixel circuit including five TFTs and one storage capacitor SC, a 5T2C pixel circuit including five TFTs and two storage capacitors SCs, a 7T2C pixel circuit including seven TFTs and two storage capacitors SCs, or the like, and the present disclosure is not limited thereto.

Figure 4:
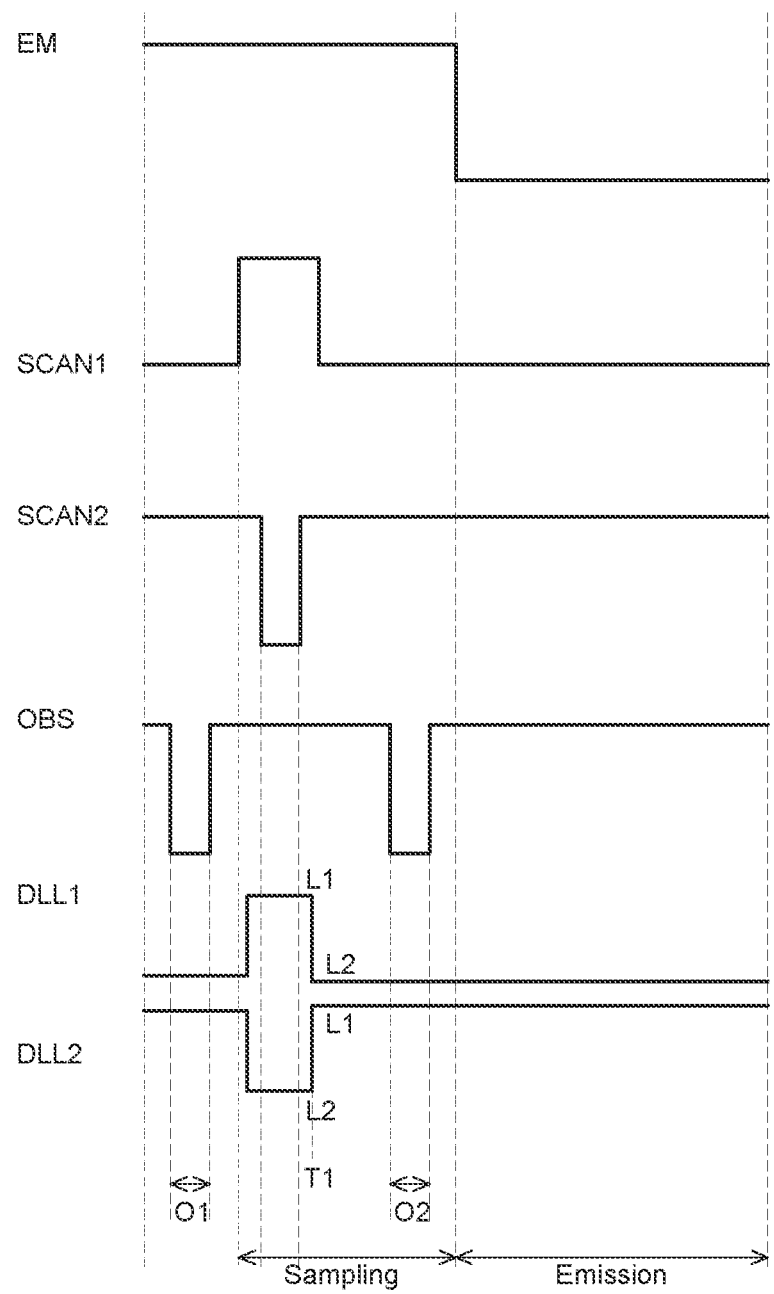
FIG. 4 is a waveform diagram illustrating an example of signals applied to a sub-pixel of an organic light-emitting display device according to an exemplary embodiment of the present disclosure during one frame.

Next, FIG. 4 is also referred to describe operations of the driving circuit of the sub-pixel SP.

FIG. 4 is a waveform diagram illustrating an example of signals applied to the sub-pixel of the display device according to an exemplary embodiment of the present disclosure.

Referring to FIG. 4, in the display device 100 according to an exemplary embodiment of the present disclosure, one frame can be divided into a sampling period and an emission period. One frame can further include an initialization period. For example, the initialization period can be a period for initializing the gate electrode of the driving transistor DT, but the present disclosure is not limited thereto.

Referring to FIG. 4, a first on-bias stress period O1 can be performed prior to the sampling period. The first on-bias stress period O1 is a period in which bias stress is applied to the source electrode of the driving transistor DT. During the first on-bias stress period O1, the on-bias stress OBS voltage is applied to the source electrode of the driving transistor DT, thereby lowering the voltage Vgs between the gate electrode and the source electrode of the driving transistor DT. Accordingly, a hysteresis effect of the driving transistor DT can be reduced or minimized by allowing the current between the source electrode and the drain electrode of the driving transistor DT to flow during the first on-bias stress period O1. In this case, the on-bias stress OBS voltage applied to the source electrode of the driving transistor DT is a constant voltage and can be selected within a voltage range sufficiently higher than an operating voltage of the light-emitting element. In this case, the on-bias stress OBS voltage can be different from the high potential power supply voltage VDD and lower than the high potential power supply voltage VDD, but is not limited thereto.

During the first on-bias stress period O1, a third scan signal Scan3 transmitted through the third scan line SL can have a low level that is a turn-on level. Accordingly, the fifth transistor T5 can be turned on, and the on-bias stress OBS voltage can be applied to the first node N1, for example, to the source electrode of the driving transistor DT.

Referring to FIG. 4, the first scan signal Scan1 transmitted through the first scan line SL1 during the sampling period can be at a high level that is a turn-on level, the second scan signal Scan2 transmitted through the second scan line SL2 can be at a low level that is a turn-on level, and the emission signal EM transmitted through the emission signal line EML can be at a high level that is a turn-off level. Accordingly, the second transistor T2, the third transistor T3, and the driving transistor DT can be turned on, while the first transistor T1 and the fourth transistor T4 can be turned off.

During the sampling period, the second transistor T2 is turned on so that the data voltage Vdata can be applied to the first node N1. In addition, since the third transistor T3 is also turned on, the driving transistor DT is in a diode connection, and the gate electrode and drain electrode of the driving transistor DT are short-circuited, so that the driving transistor DT can operate as a diode. During the sampling period, current Ids can flow between the source electrode and the drain electrode of the driving transistor DT. Since the gate electrode and the drain electrode of the driving transistor DT are in a diode connection state, a voltage of the second node N2 can rise until the voltage Vgs between the gate electrode and the source electrode of the driving transistor DT reaches a threshold voltage Vth by the current flowing from the source electrode to the drain electrode. During the sampling period, the second node N2 is charged with a voltage corresponding to a difference between the data voltage Vdata and the threshold voltage Vth of the driving transistor DT.

Meanwhile, a second on-bias stress period O2 can also be performed in the sampling period. In particular, after the second node N2 is charged with the voltage corresponding to the difference between the data voltage Vdata and the threshold voltage Vth of the driving transistor DT, at a time point at which all of the first transistor T1, the second transistor T2, the third transistor T3, the fourth transistor T4, and the driving transistor DT are turned off, the second on-bias stress period O2 can be performed. In the second on-bias stress period O2, similarly to the first on-bias stress period O1, the on-bias stress OBS voltage is applied to the source electrode of the driving transistor DT, so that a hysteresis effect of the driving transistor DT can be minimized.

During the second on-bias stress period O2, the third scan signal Scan3 transmitted through the third scan line SL can be at a low level that is a turn-on level. Accordingly, the fifth transistor T5 can be turned on, and the on-bias stress OBS voltage can be applied to the first node N1, for example, the gate electrode of the driving transistor DT.

During the emission period, the first scan signal Scan1 transmitted through the first scan line SL1 can be at a low level that is a turn-off level, the second scan signal Scan2 transmitted through the second scan line SL2 can be at a high level that is a turn-off level, and the emission signal EM transmitted through the emission signal line EML can be at a low level that is a turn-on level. Accordingly, the first transistor T1, the driving transistor DT, and the fourth transistor T4 can be turned on, while the second transistor T2 and the third transistor T3 can be turned off.

During the emission period, the first transistor T1 is turned on so that the high potential power supply voltage VDD can be applied to the first node N1. In addition, the driving transistor DT and the fourth transistor T4 are turned on, so that a current path continuing to the light-emitting element OLED through the driving transistor DT, the third node N3 and the fourth transistor T4 can be formed. As a result, a driving current Ioled passing through the source electrode and the drain electrode of the driving transistor DT can be applied to the light-emitting element OLED.

Meanwhile, the data link line DLL can be disposed in one sub-pixel SP in which the driving circuit described above is disposed. Since the display device 100 according to an exemplary embodiment of the present disclosure is the display device 100 in which the data link lines DLL are disposed in the active area AA, one sub-pixel SP can have the data link line DLL that transmits the data voltage Vdata to other sub-pixels SP. In this case, the data voltage Vdata applied to the data link line DLL can swing at an arbitrary time point. In FIG. 4, a change in voltage at the second node N2 is described assuming that the data voltage Vdata applied to the data link line DLL is changed from a first level L1 to a second level L2 or from the second level L2 to the first level L1 at a first time point T1 during the sampling period.

During the sampling period, prior to the first time point T1, the first scan signal Scan1 transmitted through the first scan line SL1 can be at a high level that is a turn-on level, the second scan signal Scan2 transmitted through the second scan line SL2 can be at low level that is a turn-on level, and the emission signal EM transmitted through the emission signal line EML can be at a high level that is a turn-off level.

Accordingly, a voltage of the source electrode of the driving transistor DT, that is the first node N1, can rise to a level of the data voltage Vdata, and a voltage of the gate electrode of the driving transistor DT can rise to a level corresponding to the difference between the data voltage Vdata and the threshold voltage Vth of the driving transistor DT.

Thereafter, when the second scan signal Scan2 rises to a high level that is a turn-off level, the first node N1 corresponding to the source electrode of the driving transistor DT and the second node N2 corresponding to the gate electrode of the driving transistor DT are floating.

Thereafter, at the first time point T1, when the data voltage Vdata applied to the data link line DLL drops from the first level L1 to the second level L2 as in a first case DLL_1, or rises from the second level L2 to the first level L1 as in a case 2 DLL_2, the voltage of the source electrode of the driving transistor DT corresponding to the second node N2 can also be varied by a fringe capacitance FC between the data link line DLL and the first node N1. Specifically, as the data voltage Vdata applied to the data link line DLL disposed adjacent to the first node N1 varies, a coupling phenomenon can occur in the first node N1. Accordingly, the fringe capacitance FC can be formed between the first node N1 and the data link line DLL. Since the fringe capacitance FC also affects the second node N2 that is the gate electrode of the driving transistor DT, the voltage of the gate electrode can also be varied. Therefore, in the emission period after the first time point T1, light is emitted by the voltage Vgs between the gate electrode and the source electrode of the driving transistor DT, which is varied by the fringe capacitance FC, so that the corresponding sub-pixel SP can have a difference in luminance with other sub-pixels SP adjacent thereto and can cause spots in a screen.

Figure 5:
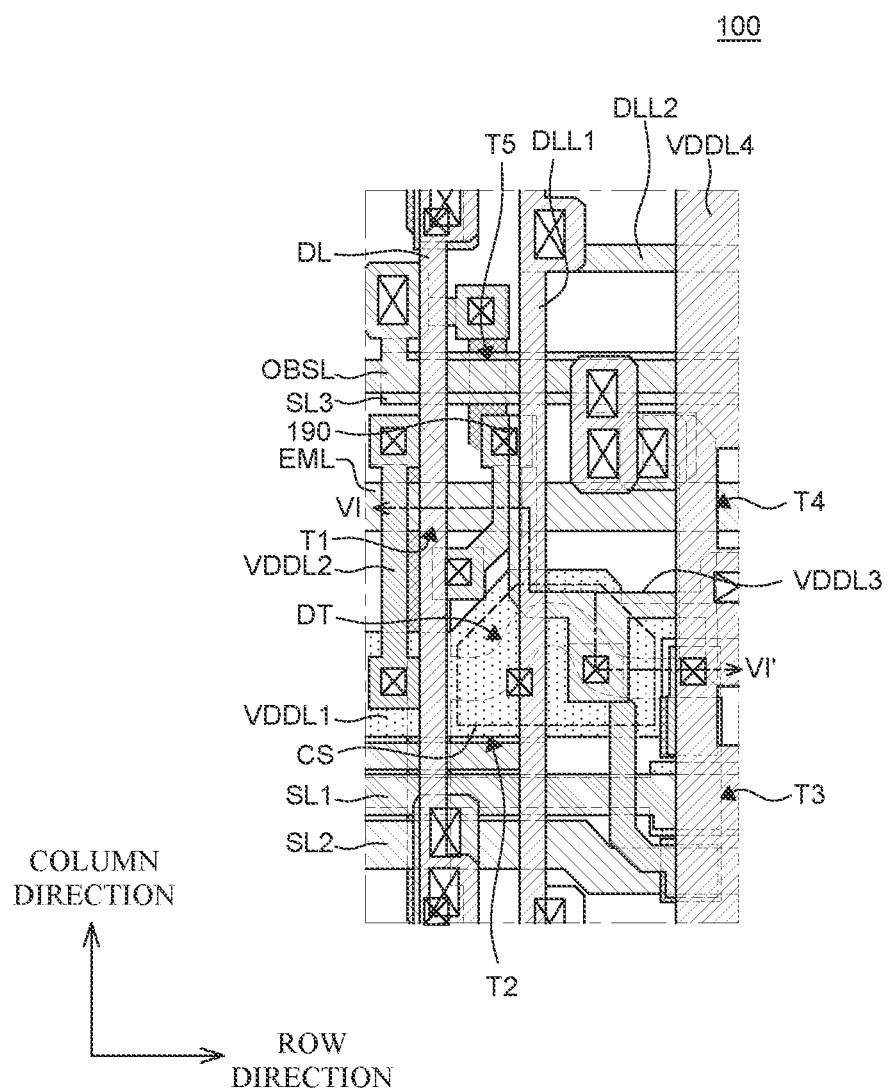
FIG. 5 is an enlarged plan view of the display device according to an exemplary embodiment of the present disclosure.
Figure 6:
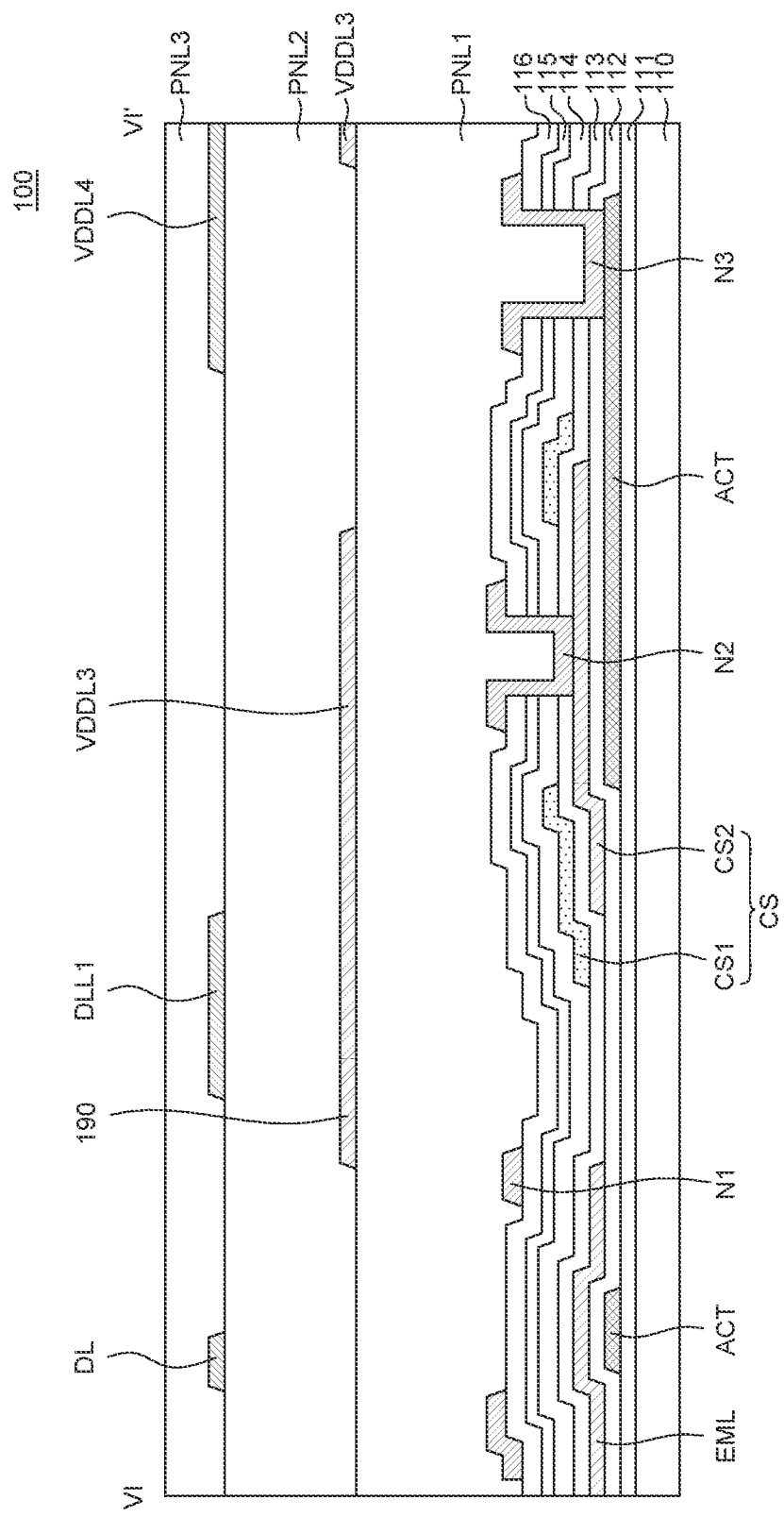
FIG. 6 is a cross-sectional view taken along VI-VI' of FIG. 5.

FIG. 5 is an enlarged plan view of the display device according to an exemplary embodiment of the present disclosure. FIG. 6 is a cross-sectional view taken along VI-VI' of FIG. 5. In FIG. 5, illustration of the light-emitting element OLED is omitted for convenience of description.

Referring to FIGS. 5 and 6, the display device 100 according to an exemplary embodiment of the present disclosure includes the substrate 110, a first planarization layer PNL1, a second planarization layer PNL2, a third planarization layer PNL3, the driving transistor DT, the first transistor T1, the second transistor T2, the third transistor T3, the fourth transistor T4, the fifth transistor T5, the storage capacitor SC, the first scan line SL1, the second scan line SL2, the third scan line SL3, the data line DL, the high potential power supply line VDDL (for example, VDDL1, VDDL2, VDDL3 and VDDL4), the on-bias stress line OBSL, and the emission signal line EML, but the present disclosure is not limited thereto.

The plurality of sub-pixels SP can include a red sub-pixel, a green sub-pixel, a blue sub-pixel, and a white sub-pixel. For example, a red sub-pixel, a white sub-pixel, a blue sub-pixel, and a green sub-pixel can be sequentially disposed in the row direction, but colors and an arrangement order of the plurality of sub-pixels SP is not limited thereto.

For example, the plurality of sub-pixels SP can include a red sub-pixel, a green sub-pixel, and a blue sub-pixel. For example, a red sub-pixel, a blue sub-pixel, and a green sub-pixel can be sequentially disposed in the row direction.

In each of the plurality of sub-pixels SP, the driving circuit including the driving transistor DT, the first transistor T1, the second transistor T2, the third transistor T3, the fourth transistor T4, the fifth transistor T5, and the storage capacitor SC, the plurality of data lines DL, a plurality of high potential power supply lines VDDL, a plurality of low potential power supply lines VSSL, a plurality of emission signal lines EML, the first scan line SL1, the second scan line SL2, the third scan line SL3, the on-bias stress line OBSL, and a bank can be disposed, but the present disclosure is not limited thereto.

Referring to FIG. 6 together, a buffer layer 111 is disposed on the substrate 110. The buffer layer 111 can prevent diffusion of moisture and/or oxygen penetrating from the outside of the substrate 110. For example, moisture permeability of the display device 100 can be controlled by controlling a thickness or laminated structure of the buffer layer 111. The buffer layer 111 can be formed of an inorganic material, and can be composed of a single layer or multi-layers of, for example, silicon oxide (SiOx) or silicon nitride (SiNx), but is not limited thereto, for example, the buffer layer 111 can be composed of n layers of silicon oxide (SiOx) or silicon nitride (SiNx) alternately stacked, where n is an integer.

The driving transistor DT, the first transistor T1, the second transistor T2, the third transistor T3, the fourth transistor T4, the fifth transistor T5, and the storage capacitor SC are disposed in each of the plurality of sub-pixels SP on the buffer layer 111.

The driving transistor DT can include an active layer ACT, a gate electrode GE, the source electrode, and the drain electrode.

The active layer ACT of the driving transistor DT is disposed on the buffer layer 111. The active layer ACT of the driving transistor DT can include polycrystalline silicon. For example, the active layer ACT can include low-temperature polysilicon (LTPS). For example, polysilicon is formed by depositing an amorphous silicon (a-Si) material on the buffer layer 111 and performing a dehydrogenation process and a crystallization process, and the polysilicon can be patterned to form the active layer ACT.

The active layer ACT of the driving transistor DT can include a channel region, a source region, and a drain region. The source region refers to a portion of the active layer ACT connected to the source electrode, and the drain region refers to a portion of the active layer ACT connected to the drain electrode. For example, the source region and the drain region can be formed by ion doping (impurity doping) of the active layer ACT, and the channel region can be disposed between the source region and the drain region.

A first gate insulating layer 112 is disposed on the active layer ACT. The first gate insulating layer 112 is a layer for insulating the gate electrode GE and the active layer ACT, and can be formed of an insulating material. For example, the first gate insulating layer 112 can be composed of a single layer or multiple layers of silicon oxide (SiOx) or silicon nitride (SiNx), but is not limited thereto, for example, the first gate insulating layer 112 can be composed of n layers of silicon oxide (SiOx) or silicon nitride (SiNx) alternately stacked, where n is an integer. Contact holes can be formed in the first gate insulating layer 112 to connect the source electrode and the drain electrode of the driving transistor DT to the source region and the drain region of the active layer ACT of the driving transistor DT, respectively.

The gate electrode GE is disposed on the first gate insulating layer 112 to overlap the active layer ACT. The gate electrode GE can be formed of a conductive material, for example, copper (Cu), aluminum (Al), molybdenum (Mo), nickel (Ni), titanium (Ti), chromium (Cr), or an alloy thereof, but is not limited thereto.

A first capacitor electrode SC1 can be disposed on the first gate insulating layer 112 to overlap the driving transistor DT.

The first capacitor electrode SC1 can be formed of the same material as the gate electrode GE. The first capacitor electrode SC1 can be formed of a conductive material, for example, copper (Cu), aluminum (Al), molybdenum (Mo), nickel (Ni), titanium (Ti), chromium (Cr), or an alloy thereof, but is not limited thereto. As illustrated in FIG. 6, the first capacitor electrode SC1 can be integrally formed with the gate electrode GE in a same process, but is not limited thereto. Also, the first capacitor electrode SC1 can be connected to the second node N2, but is not limited thereto.

The second scan line SL2, the third scan line SL3, and the emission signal line EML are disposed on the first gate insulating layer 112. The second scan line SL2, the third scan line SL3, and the emission signal line EML can be formed of the same material as the gate electrode GE and the first capacitor electrode SC1. For example, the second scan line SL2, the third scan line SL3, and the emission signal line EML can be formed of a conductive material, for example, copper (Cu), aluminum (Al), molybdenum (Mo), nickel (Ni), titanium (Ti), chromium (Cr), or an alloy thereof, but is not limited thereto.

The second scan line SL2 can be connected to the gate electrode of the second transistor T2. The second scan line SL2 can be integrally formed with the gate electrode of the second transistor T2 in a same process, but is not limited thereto.

The third scan line SL3 can be connected to the gate electrode of the fifth transistor T5. The third scan line SL3 can be integrally formed with the gate electrode of the fifth transistor T5 in a same process, but is not limited thereto.

The emission signal line EML can be connected to the gate electrode of the first transistor T1 and the gate electrode of the fourth transistor T4. The emission signal line EML can be integrally formed with the gate electrode of the first transistor T1 and the gate electrode of the fourth transistor T4 in a same process, but is not limited thereto.

A first interlayer insulating layer 113 is disposed on the gate electrode GE, the first capacitor electrode SC, the second scan line SL2, the third scan line SL3, and the emission signal line EML. The first interlayer insulating layer 113 can be formed of an insulating material. For example, the first interlayer insulating layer 113 can be composed of a single layer or multiple layers of silicon oxide (SiOx) or silicon nitride (SiNx), but is not limited thereto, for example, the first interlayer insulating layer 113 can be composed of n layers of silicon oxide (SiOx) or silicon nitride (SiNx) alternately stacked, where n is an integer. Contact holes can be formed in the first interlayer insulating layer 113 to expose the source region and the drain region of the active layer ACT of the driving transistor DT.

A second capacitor electrode SC2 is disposed on the first interlayer insulating layer 113. The second capacitor electrode SC2 can be formed of a conductive material, for example, copper (Cu), aluminum (Al), molybdenum (Mo), nickel (Ni), titanium (Ti), chromium (Cr), or an alloy thereof, but is not limited thereto. The second capacitor electrode SC2 is disposed to overlap the first capacitor electrode SC1 and can be disposed on the driving transistor DT to overlap the driving transistor DT.

A first high potential power supply line VDDL1 is disposed on the first interlayer insulating layer 113. The first high potential power supply line VDDL1 is disposed in the row direction and can be integrally formed with the second capacitor electrode SC2 illustrated in FIG. 6, but is not limited thereto. The first high potential power supply line VDDL1 can be formed of the same material as the second capacitor electrode SC2. The first high potential power supply line VDDL1 can be formed of a conductive material, for example, copper (Cu), aluminum (Al), molybdenum (Mo), nickel (Ni), titanium (Ti), chromium (Cr), or an alloy thereof, but is not limited thereto.

A second interlayer insulating layer 114 is disposed on the second capacitor electrode SC2 and the first high potential power supply line VDDL1. The second interlayer insulating layer 114 can be formed of an insulating material. For example, the second interlayer insulating layer 114 can be composed of a single layer or multiple layers of silicon oxide (SiOx) or silicon nitride (SiNx), but is not limited thereto, for example, the second interlayer insulating layer 114 can be composed of n layers of silicon oxide (SiOx) or silicon nitride (SiNx) alternately stacked, where n is an integer. Contact holes can be formed in the second interlayer insulating layer 114 to expose the source region and the drain region of the active layer ACT of the driving transistor DT.

An additional buffer layer can be disposed on the second interlayer insulating layer 114. The additional buffer layer can be composed of a single layer or multiple layers of silicon oxide (SiOx) or silicon nitride (SiNx), but is not limited thereto, for example, the additional buffer layer can be composed of n layers of silicon oxide (SiOx) or silicon nitride (SiNx) alternately stacked, where n is an integer. The third transistor T3 is disposed on the second interlayer insulating layer 114.

An active layer of the third transistor T3 can be disposed on the second interlayer insulating layer 114. The active layer of the third transistor T3 can be disposed after a process of activating and hydrogenating the active layer ACT of the driving transistor DT. The active layer of the third transistor T3 can be formed of an oxide semiconductor. For example, the active layer of the third transistor T3 can be formed of various oxide semiconductors such as zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium zinc oxide (IZO), indium gallium tin oxide (IGTO), indium gallium oxide (IGO) and the like, but is not limited thereto.

A second gate insulating layer 115 can be disposed on the active layer of the third transistor T3. The second gate insulating layer 115 can be formed of a single layer or multilayers of silicon oxide (SiOx) or silicon nitride (SiNx), but is not limited thereto, for example, the second gate insulating layer 115 can be composed of n layers of silicon oxide (SiOx) or silicon nitride (SiNx) alternately stacked, where n is an integer. Contact holes can be formed in the second gate insulating layer 115 to connect the source electrode and the drain electrode of the driving transistor DT to the source region and the drain region of the active layer ACT of the driving transistor DT, respectively.

The gate electrode of the third transistor T3 can be disposed on the second gate insulating layer 115. The gate electrode of the third transistor T3 can be formed of a conductive material, for example, copper (Cu), aluminum (Al), molybdenum (Mo), nickel (Ni), titanium (Ti), chromium (Cr), or an alloy thereof, but is not limited thereto.

The first scan line SL1 can be disposed on the second gate insulating layer 115. The first scan line SL1 can be formed of a conductive material, for example, copper (Cu), aluminum (Al), molybdenum (Mo), nickel (Ni), titanium (Ti), chromium (Cr), or an alloy thereof, but is not limited thereto. The first scan line SL1 can be connected to the gate electrode of the third transistor T3. For example, the first scan line SL1 can be integrally formed with the gate electrode of the third transistor T3, but is not limited thereto.

A third interlayer insulating layer 116 can be disposed on the gate electrode of the third transistor T3 and the first scan line SL1. The third interlayer insulating layer 116 can be formed of an insulating material. For example, the third interlayer insulating layer 116 can be composed of a single layer or multiple layers of silicon oxide (SiOx) or silicon nitride (SiNx), but is not limited thereto, for example, the third interlayer insulating layer 116 can be composed of n layers of silicon oxide (SiOx) or silicon nitride (SiNx) alternately stacked, where n is an integer. Contact holes can be formed in the third interlayer insulating layer 116 to expose the source region and the drain region of the active layer ACT of the driving transistor DT.

The source electrode and the drain electrode of the driving transistor DT can be disposed on the third interlayer insulating layer 116. The source electrode and the drain electrode of the driving transistor DT can be connected to the active layer ACT through contact holes formed in the first gate insulating layer 112, the first interlayer insulating layer 113, the second interlayer insulating layer 114, the second gate insulating layer 115, and the third interlayer insulating layer 116. The source electrode and the drain electrode of the driving transistor DT can be formed of a conductive material, for example, copper (Cu), aluminum (Al), molybdenum (Mo), nickel (Ni), titanium (Ti), chromium (Cr), or an alloy thereof, but are not limited thereto.

Meanwhile, the source electrode of the driving transistor DT disposed on the third interlayer insulating layer 116 can be connected to the drain electrode of the second transistor T2 and the drain electrode of the fifth transistor T5. Accordingly, the source electrode of the driving transistor DT can be referred to as the first node N1.

In addition, the drain electrode of the driving transistor DT disposed on the third interlayer insulating layer 116 can be connected to the drain electrode of the third transistor T3 and the source electrode of the fourth transistor T4. Accordingly, the drain electrode of the driving transistor DT can be referred to as the third node N3.

The second node N2 to which the drain electrode of the third transistor T3 and the gate electrode GE of the driving transistor DT are connected can be disposed on the third interlayer insulating layer 116. Accordingly, a potential the same as that of the gate electrode GE of the driving transistor DT can be applied to the second node N2. The second node N2 can be formed of the same material as the source electrode and the drain electrode of the driving transistor DT. The second node N2 can be formed of a conductive material, for example, copper (Cu), aluminum (Al), molybdenum (Mo), nickel (Ni), titanium (Ti), chromium (Cr), or an alloy thereof, but is not limited thereto.

A second high potential power supply line VDDL2 is disposed on the third interlayer insulating layer 116. The second high potential power supply line VDDL2 can connect the first high potential power supply line VDDL1 and the first node N1. The second high potential power supply line VDDL2 can be formed of the same material as the source electrode and the drain electrode of the driving transistor DT. The second high potential power supply line VDDL2 can be formed of a conductive material, for example, copper (Cu), aluminum (Al), molybdenum (Mo), nickel (Ni), titanium (Ti), chromium (Cr), or an alloy thereof, but is not limited thereto.

The first planarization layer PNL1 is disposed on the source electrode and the drain electrode of the driving transistor DT and the second high potential power supply line VDDL2. The first planarization layer PNL1 is an insulating layer planarizing an upper portion of the substrate 110. The first planarization layer PNL1 can be formed of an organic material, and can be composed of a single layer or multilayers of, for example, polyimide or photoacryl, but the present disclosure is not limited thereto.

The second portion DLL2 of the data link line DLL, the on-bias stress line OBSL, a third high potential power supply line VDDL3, and a shielding layer 190 are disposed on the first planarization layer PNL1.

The second portion DLL2 of the data link line DLL can be disposed on the first planarization layer PNL1. The second portion DLL2 of the data link line DLL can be formed of a conductive material, for example, copper (Cu), aluminum (Al), molybdenum (Mo), nickel (Ni), titanium (Ti), chromium (Cr), or an alloy thereof, but is not limited thereto.

The second portion DLL2 of the data link line DLL is disposed to cross the first portion DLL1 of the data link line DLL on the substrate 110, and can be electrically connected to the first portion DLL1 of the data link line DLL.

The on-bias stress line OBSL is disposed on the first planarization layer PNL1. The on-bias stress line OBSL can be formed of the same material as the second portion DLL2 of the data link line DLL. The on-bias stress line OBSL can be formed of a conductive material, for example, copper (Cu), aluminum (Al), molybdenum (Mo), nickel (Ni), titanium (Ti), chromium (Cr), or an alloy thereof, but is not limited thereto.

Meanwhile, the on-bias stress line OBSL can be disposed to overlap the data line DL disposed on an upper portion thereof in a partial area. For example, as illustrated in FIG. 5, the on-bias stress line OBSL can be disposed to extend in the row direction. Accordingly, the on-bias stress line OBSL can cross the data line DL disposed to extend in the column direction and can overlap the data line DL.

The third high potential power supply line VDDL3 is disposed on the first planarization layer PNL1. The third high potential power supply line VDDL3 can be formed of the same material as the second portion DLL2 of the data link line DLL and the on-bias stress line OBSL. The third high potential power supply line VDDL3 can be formed of a conductive material, for example, copper (Cu), aluminum (Al), molybdenum (Mo), nickel (Ni), titanium (Ti), chromium (Cr), or an alloy thereof, but is not limited thereto.

Meanwhile, the third high potential power supply line VDDL3 can be connected to the second node N2.

The third high potential power supply line VDDL3 can be disposed to overlap the first high potential power supply line VDDL1 disposed on a lower portion thereof in a partial area. For example, the third high potential power supply line VDDL3 can be disposed to overlap the first high potential power supply line VDDL1 between the driving transistors DT disposed in the row direction.

Referring to FIGS. 5 and 6, the shielding layer 190 is disposed on the first planarization layer PNL1. The shielding layer 190 can be formed of the same material on the same layer as the second portion DLL2 of the data link line DLL, the on-bias stress line OBSL, and the third high potential power supply line VDDL3. The shielding layer 190 can be formed of a conductive material, for example, copper (Cu), aluminum (Al), molybdenum (Mo), nickel (Ni), titanium (Ti), chromium (Cr), or an alloy thereof, but is not limited thereto.

Referring to FIG. 5, the shielding layer 190 can be disposed on the driving transistor DT. The shielding layer 190 can be disposed on the driving transistor DT to overlap the driving transistor DT. For example, as illustrated in FIGS. 5 and 6, the shielding layer 190 can be disposed to overlap the first node N1 having the same potential as the source electrode of the driving transistor DT.

The shielding layer 190 can be connected to one of the plurality of high potential power supply lines VDDL disposed on the substrate 110. The shielding layer 190 can be electrically connected to the third high potential power supply line VDDL3, for example, as illustrated in FIG. 6. The shielding layer 190 can be connected to the third high potential power supply line VDDL3 at a position thereof overlapping the gate electrode of the driving transistor DT, but the position at which the shielding layer 190 and the third high potential power supply line VDDL3 are connected is not limited thereto.

When the shielding layer 190 is integrally formed with the third high potential power supply line VDDL3, a constant voltage can be applied to the shielding layer 190. For example, the high potential power supply voltage VDD can be applied to the shielding layer 190.

Meanwhile, referring to FIG. 6, the shielding layer 190 can be disposed to overlap the plurality of data link lines DLL disposed on an upper portion thereof. For example, the shielding layer 190 can overlap the first portions DLL1 of the plurality of data link lines DLL. Accordingly, the shielding layer 190 can be disposed between the driving transistor DT and the plurality of data link lines DLL. Accordingly, the shielding layer 190 can reduce variations in voltage of the first node N1 and the second node N2 due to voltage changes of the plurality of data link lines DLL during the emission period.

The second planarization layer PNL2 is disposed on the second portion DLL2 of the data link line DLL, the on-bias stress line OBSL, the third high potential power supply line VDDL3, and the shielding layer 190. The second planarization layer PNL2 is an insulating layer planarizing the upper portion of the substrate 110. The second planarization layer PNL2 can be formed of an organic material. The second planarization layer PNL2 can be formed of an organic material, and can be composed of a single layer or multilayers of, for example, polyimide or photoacryl, but is not limited thereto.

The data line DL, the first portion DLL1 of the data link line DLL, and a fourth high potential power supply line VDDL4 are disposed on the second planarization layer PNL2.

The data line DL is disposed on the second planarization layer PNL2. The data line DL can be formed of a conductive material, for example, copper (Cu), aluminum (Al), molybdenum (Mo), nickel (Ni), titanium (Ti), chromium (Cr), or an alloy thereof, but is not limited thereto.

Referring to FIG. 5, the data line DL is disposed to overlap the driving transistor DT. The data line DL is connected to the source electrode of the second transistor T2 and can apply the data voltage Vdata to the driving transistor DT disposed in an area where it overlaps the data line DL.

Meanwhile, the data line DL illustrated in FIGS. 5 and 6 can be the first data line DL1. For example, the data line DL illustrated in FIGS. 5 and 6 can extend from the driver integrated circuit D-IC and be connected to the sub-pixel SP without a separate link line.

The first portion DLL1 of the data link line DLL is disposed on the second planarization layer PNL2. The first portion DLL1 can be formed of the same material as the data line DL. The first portion DLL1 can be formed of a conductive material, for example, copper (Cu), aluminum (Al), molybdenum (Mo), nickel (Ni), titanium (Ti), chromium (Cr), or an alloy thereof, but is not limited thereto.

Referring to FIG. 6, the first portion DLL1 is disposed between the data line DL and the fourth high potential power supply line VDDL4 on the second planarization layer PNL2. The first portion DLL1 of the plurality of data link lines DLL can be disposed above the driving transistor DT to overlap the driving transistor DT. For example, the first portion DLL1 extending in the column direction can be disposed to overlap a plurality of the driving transistors DT disposed in the same column.

Meanwhile, the first portion DLL1 can be insulated from the plurality of driving transistors DT disposed to overlap at a lower portion thereof. In addition, the first portion DLL1 can receive different data signals from the plurality of driving transistors DT disposed in the same column as the first portion DLL1. For example, when the first portion DLL1 is disposed on the driving transistors DT disposed in a first column, the first portion DLL1 disposed in the first column can apply data signals to the driving transistors DT disposed in columns different from the first column through the second portion DLL2. Accordingly, the data link line DLL among the plurality of data link lines DLL, that is disposed to overlap the driving transistor DT can transmit a data signal to the sub-pixel SP different from the sub-pixel SP in which the driving transistor DT is disposed.

The fourth high potential power supply line VDDL4 is disposed on the second planarization layer PNL2. The fourth high potential power supply line VDDL4 can be formed of the same material as the data line DL and the first portion DLL1. The first portion DLL1 can be formed of a conductive material, for example, copper (Cu), aluminum (Al), molybdenum (Mo), nickel (Ni), titanium (Ti), chromium (Cr), or an alloy thereof, but is not limited thereto. The fourth high potential power supply line VDDL4 can be disposed to extend in the column direction like the data line DL and the first portion DLL1, but is not limited thereto.

The third planarization layer PNL3 is disposed on the data line DL, the first portion DLL1 of the data link line DLL, and the fourth high potential power supply line VDDL4. The third planarization layer PNL3 is an insulating layer planarizing the upper portion of the substrate 110. The third planarization layer PNL3 can be formed of an organic material. The third planarization layer PNL3 can be formed of an organic material and can be composed of a single layer or multilayers of for example, polyimide or photoacryl, but is not limited thereto.

Meanwhile, the light-emitting element OLED including the anode, a light-emitting layer, and a cathode can be disposed on the third planarization layer PNL3. The light-emitting element OLED is connected to the drain electrode of the fourth transistor T4 and can emit light according to a data signal applied to the data line DL.

A display device in which link lines for connecting an external circuit and a driving circuit disposed in the non-active area NA and the plurality of sub-pixels SP disposed in the active area AA are disposed in the non-active area AA is used in the related art. For example, when the driving circuit and the external circuit are bent toward a rear surface of the substrate 110, a plurality of link lines are disposed in the bending area BA and the non-active area NA disposed between the bending area BA and the active area AA. When the link line for connecting the data line DL and the driver integrated circuit D-IC disposed in the outer portion of the substrate 110 is disposed obliquely, it is vulnerable to stress and can be damaged. Accordingly, the plurality of link lines are disposed in the non-active area NA disposed between the bending area BA and the active area AA. Thus, as the link lines are disposed in the non-active area NA, a reduction of a bezel area of the display device 100 is restricted.

Accordingly, in order to reduce the bezel area of the display device 100, the link line is disposed inside the active area AA of the display device 100. For example, the first data lines DL1 extending linearly from the driver integrated circuit D-IC and connected to the plurality of sub-pixels SP, and the second data lines DL2 extending linearly from the driver integrated circuit D-IC and connected to the plurality of sub-pixels SP through the plurality of data link lines DLL are disposed in the active area AA. Thus, as the data link lines DLL are disposed in the active area AA, the bezel area of the display device 100 is reduced. However, on the sub-pixels SP disposed in the column direction, as the data link line DLL for transferring the data voltage Vdata to other sub-pixels SP is disposed, a parasitic capacitance occurs between the driving transistor DT disposed in the sub-pixel SP and the data link line DLL disposed to overlap the driving transistor DT. For example, a data signal different from that of the data line DL connected to the driving transistor DT can be applied to the data link line DLL disposed to overlap the driving transistor DT. As such, as the data link line DLL (to which a signal varying at a time point different from the first time point T1 at which the voltage of the second node N2 is varied is applied) is above the driving transistor DT, a parasitic capacitance can be formed at the first node N1 and the second node N2. Therefore, the voltage between the gate electrode and the source electrode of the driving transistor DT is varied by the parasitic capacitance between the data link line DLL and the first node N1 and the second node N2, and a difference in luminance with adjacent other sub-pixels SP can occur, and spots on a screen can occur.

Accordingly, in the display device 100 according to an exemplary embodiment of the present disclosure, a parasitic capacitance generated between the first node N1 and the data link line DLL can be reduced by disposing the high potential power supply line VDDL to which a constant voltage is applied on the first node N1. Specifically, among the lines disposed adjacent to the first node N1, the high potential power supply line VDDL to which the constant voltage is applied is extended and disposed between the first node N1 and the data link line DLL. Accordingly, the parasitic capacitance occurring between the first node N1 and the data link line DLL can be reduced or minimized, and a variation in the voltage Vgs between the gate electrode and the source electrode of the driving transistor DT can be reduced or minimized.

In addition, in the display device 100 according to an exemplary embodiment of the present disclosure, the first planarization layer PNL1 and the second planarization layer PNL2 are disposed on the driving transistor DT, and the first portion DLL1 of the data link line DLL is disposed on the second planarization layer PNL2. Accordingly, the first node N1 and the first portion DLL1 of the data link line DLL can be spaced apart from each other by the sum of thicknesses of the first planarization layer PNL1 and the second planarization layer PNL2. Therefore, a parasitic capacitance generated between the first node N1 and the data link line DLL can be reduced or minimized as a distance between the first node N1 and the first portion DLL1 of the data link line DLL increases.

Figure 7:
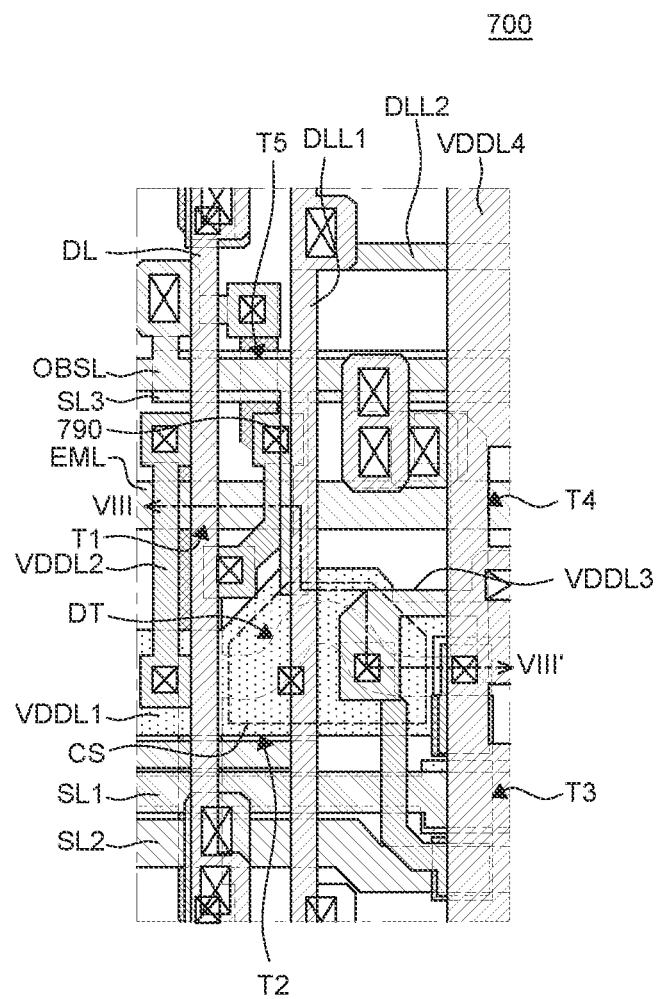
FIG. 7 is an enlarged plan view of a display device according to another exemplary embodiment of the present disclosure.
Figure 8:
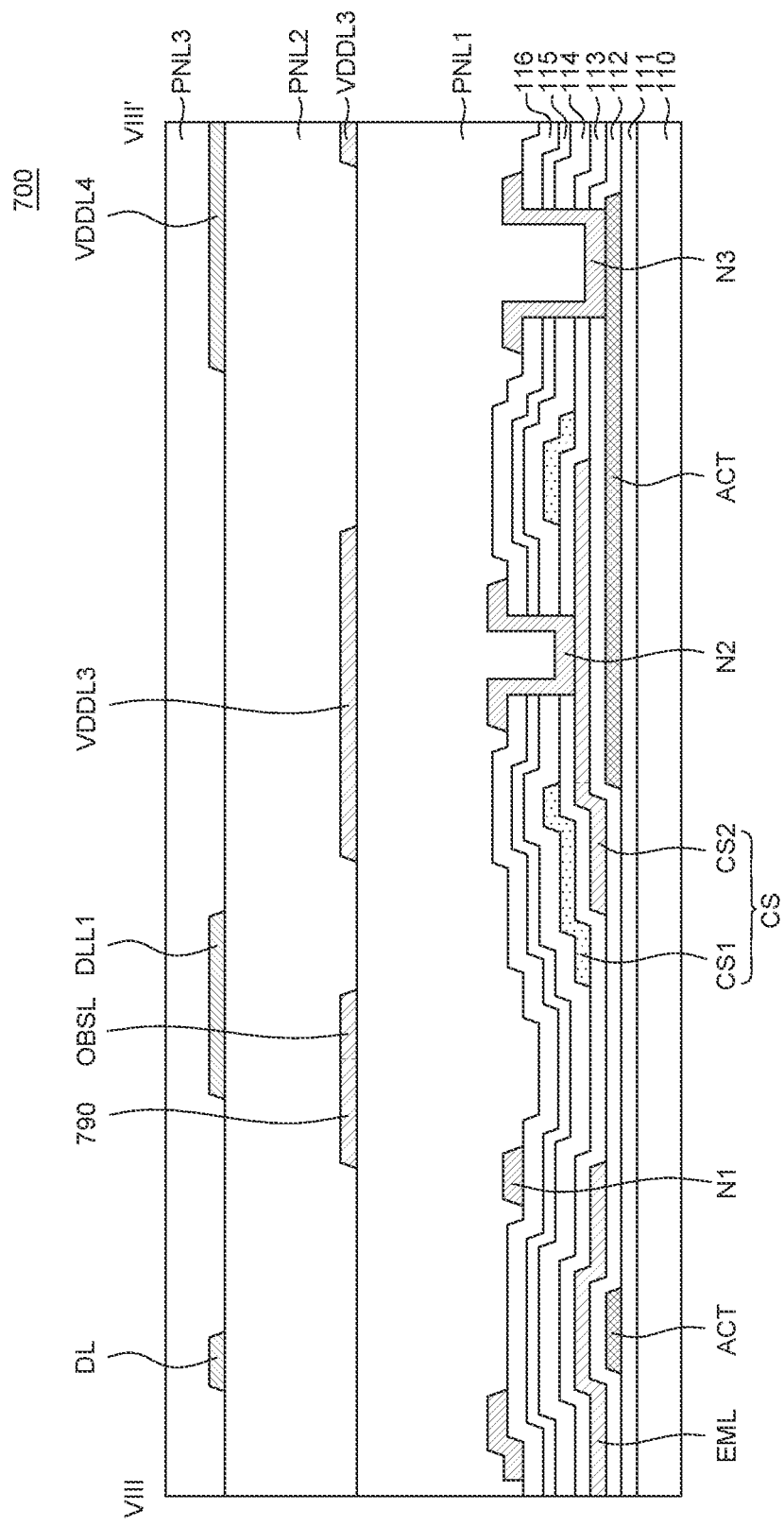
FIG. 8 is a cross-sectional view taken along VIII-VIII' of FIG. 7.

FIG. 7 is an enlarged plan view of a display device according to another exemplary embodiment of the present disclosure. FIG. 8 is a cross-sectional view taken along VIII-VIII' of FIG. 7. Since other configurations of a display device 700 of FIGS. 7 and 8 are substantially identical to those of the display device 100 of FIGS. 1 to 6 except for only a difference in terms of a shielding layer 790, redundant descriptions will be omitted or briefly provided. In FIG. 6, an illustration of the light-emitting element OLED is omitted for convenience of description.

Referring to FIGS. 7 and 8, the shielding layer 790 is disposed on the first planarization layer PNL1. The shielding layer 790 can be disposed to overlap the driving transistor DT. For example, the shielding layer 790 can be disposed to overlap the first node N1 having the same potential as the source electrode.

The shielding layer 790 can be connected to the on-bias stress line OBSL disposed on the substrate 110. For example, as illustrated in FIG. 7, the shielding layer 790 can be connected to the on-bias stress line OBSL in an area where the on-bias stress line OBSL and the data line DL cross each other, but a position where the shielding layer 790 and the on-bias stress line OBSL are connected is not limited thereto.

When the shielding layer 790 is integrally formed with the on-bias stress line OBSL, a constant voltage can be applied to the shielding layer 790. For example, the on-bias stress OBS voltage can be applied to the shielding layer 790.

In a display device 700 according to another exemplary embodiment of the present disclosure, the first planarization layer PNL1 and the second planarization layer PNL2 are disposed on the driving transistor DT, and the first portion DLL1 of the data link line DLL is disposed on the second planarization layer PNL2. Therefore, a parasitic capacitance generated between the first node N1 and the data link line DLL can be reduced or minimized as the distance between the first node N1 and the first portion DLL1 of the data link line DLL increases.

Also, in the display device 700 according to another exemplary embodiment of the present disclosure, the shielding layer 790 disposed on the first node N1 can be connected to the on-bias stress line OBSL. In the case of performing shielding with the high potential power supply line VDDL to remove a fringe capacitance FC between the first node N1 and the data link line DLL, the fringe capacitance between the high potential power supply line VDDL and the data link line DLL increases, a ripple can occur in the high potential power supply voltage VDD transmitted through the high potential power supply line VDDL. Accordingly, in the display device 700 according to another exemplary embodiment of the present disclosure, spots on a screen can be further prevented by connecting the shielding layer 790 disposed on the first node N1 with the on-bias stress line OBSL. For example, since a voltage is applied to the on-bias stress line OBSL at a time point at which the driving transistor DT is turned off, even if a coupling phenomenon occurs between the first node N1 and the on-bias stress line OBSL, a defect may not occur in driving the display device 700. Therefore, in the display device 700 according to another exemplary embodiment of the present disclosure, the occurrence of spots on a screen can be reduced by decreasing a difference in luminance due to the variation of the first node N1.

The exemplary embodiments of the present disclosure can also be described as follows:

According to an aspect of the present disclosure, there is provided a display device. The display device comprises a substrate including an active area including a plurality of sub-pixels and a non-active area, a plurality of light-emitting elements disposed in the plurality of sub-pixels, a plurality of data lines disposed in the active area, a plurality of data link lines disposed in the active area and transmitting a data voltage to the plurality of data lines, driving transistors disposed in the plurality of sub-pixels and a shielding layer disposed over the driving transistors to overlap a conductive layer connected to a source electrode of at least one of the driving transistors, wherein a constant voltage is applied to the shielding layer during operation of the display device.

The plurality of data lines can include a plurality of first data lines and a plurality of second data lines, the plurality of first data lines being disposed in a central portion of the substrate, and the plurality of second data lines being disposed outside the plurality of first data lines, and the plurality of data link lines include first portions and second portions, the first portions being disposed in the central portion of the substrate and between the plurality of first data lines, and the second portions being disposed in a direction crossing the plurality of data lines and connected to the first portions.

The shielding layer can be disposed between the driving transistors and the plurality of data link lines in the thickness direction of the display device, and overlaps with the first portions of the plurality of data link lines.

The shielding layer can be disposed between the driving transistor and the plurality of data link lines.

Among the plurality of data link lines, the data link line disposed to overlap the driving transistor can transmit a data signal to a sub-pixel different from a sub-pixel in which the driving transistor is disposed.

The display device can further comprises a planarization layer, and the planarization layer can include a first planarization layer, a second planarization layer on the first planarization layer, and a third planarization layer on the second planarization layer, wherein the first planarization layer can be disposed on the driving transistor, the shielding layer is disposed on the first planarization layer, the second planarization layer can be disposed on the shielding layer, the plurality of data lines and the plurality of data link lines can be disposed on the second planarization layer, and the third planarization layer can be disposed on the plurality of data lines and the plurality of data link lines.

The plurality of data link lines can include first portions disposed between the plurality of data lines and second portions connected to the first portions and crossing the plurality of data lines, wherein the first portions can be disposed on the second planarization layer.

A high potential power supply voltage can be applied to the shielding layer. The shielding layer can extend from a high potential power supply line.

An on-bias stress (OBS) voltage can be applied to the shielding layer. The shielding layer can extend from an on-bias stress line.

According to an aspect of the present disclosure, a plurality of pixel circuits disposed in the plurality of sub-pixels can include, a first transistor including a source electrode connected to a high potential power supply line and a gate electrode connected to an emission signal line, a capacitor connected to the high potential power supply line, a second transistor including a source electrode connected to the plurality of data line, a drain electrode connected to the first transistor, and a gate electrode connected to a second scan line, a driving transistor having a source electrode connected to the first transistor and the second transistor at a first node, and including a gate electrode connected to the capacitor, a third transistor including a source electrode connected to a gate electrode of the driving transistor and the capacitor at a second node, a drain electrode connected to the drain electrode of the driving transistor, and a gate electrode connected to the first scan line, a fourth transistor having a source electrode connected to the drain electrode of the driving transistor and the drain electrode of the third transistor, a drain electrode connected to the light-emitting element, and a gate electrode connected to the emission signal line; and a fifth transistor including a source electrode connected to an on-bias stress line, a drain electrode connected to the source electrode of the driving transistor at the first node, and a gate electrode connected to a third scan line.

An on-bias stress OBS voltage supplied by the on-bias stress line can be lower than a high potential power supply voltage supplied by the high potential power supply line.

The shielding layer can be disposed to overlap the first node.

The shielding layer can be connected to the on-bias stress line to reduce a variation in voltages of the first node and the second node due to voltage changes of the plurality of data link lines.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a substrate including an active area and a non-active area, the active area including a plurality of sub-pixels;
   a plurality of light-emitting elements disposed in the plurality of sub-pixels;
   a plurality of data lines (DL) disposed in the active area;
   a plurality of data link lines (DLL) disposed in the active area, and configured to transmit a data voltage to the plurality of data lines;
   driving transistors disposed in the plurality of sub-pixels; and
   a shielding layer disposed on the driving transistors to overlap a conductive layer connected to a source electrode of one driving transistor among the driving transistors,
   wherein a constant voltage is applied to the shielding layer during an operation of the display device, and
   wherein the shielding layer is disposed between the one driving transistor and the plurality of data link lines.

2. The display device of claim 1, wherein the plurality of data lines include a plurality of first data lines and a plurality of second data lines, the plurality of first data lines being disposed in a central portion of the substrate, and the plurality of second data lines being disposed outside the plurality of first data lines, and
   wherein the plurality of data link lines include first portions and second portions, the first portions being disposed in the central portion of the substrate and between the plurality of first data lines, and the second portions being disposed in a direction crossing the plurality of data lines and connected to the first portions.

3. The display device of claim 2, wherein the shielding layer is disposed between the driving transistors and the plurality of data link lines in a thickness direction of the display device, and overlaps with the first portions of the plurality of data link lines.

4. The display device of claim 1, wherein, among the plurality of data link lines, one data link line disposed to overlap the one driving transistor transmits a data signal to a sub-pixel different from a sub-pixel in which the one driving transistor is disposed.

5. The display device of claim 1, further comprising a planarization layer,
   wherein the planarization layer includes a first planarization layer, a second planarization layer on the first planarization layer, and a third planarization layer on the second planarization layer,
   the first planarization layer is disposed on the one driving transistor,
   the shielding layer is disposed on the first planarization layer,
   the second planarization layer is disposed on the shielding layer,
   the plurality of data lines and the plurality of data link lines are disposed on the second planarization layer, and
   the third planarization layer is disposed on the plurality of data lines and the plurality of data link lines.

6. The display device of claim 5, wherein the plurality of data link lines include first portions disposed between the plurality of data lines and second portions connected to the first portions and crossing the plurality of data lines, and
   wherein the first portions are disposed on the second planarization layer.

7. The display device of claim 1, wherein a high potential power supply voltage is applied to the shielding layer through a high potential power supply line.

8. The display device of claim 7, wherein the shielding layer extends from the high potential power supply line.

9. The display device of claim 1, wherein an on-bias stress OBS voltage is applied to the shielding layer through an on-bias stress line.

10. The display device of claim 9, wherein the shielding layer extends from the on-bias stress line.

11. The display device of claim 1, wherein a plurality of pixel circuits disposed in the plurality of sub-pixels include:
   a first transistor including a source electrode connected to a high potential power supply line and a gate electrode connected to an emission signal line;
   a capacitor connected to the high potential power supply line;
   a second transistor including a source electrode connected to the data line, a drain electrode connected to the first transistor, and a gate electrode connected to a second scan line;
   the one driving transistor including the source electrode connected to the first transistor and the second transistor at a first node, and including a gate electrode connected to the capacitor;
   a third transistor including a source electrode connected to a gate electrode of the one driving transistor and the capacitor at a second node, a drain electrode connected to the drain electrode of the one driving transistor, and a gate electrode connected to the first scan line;
   a fourth transistor including a source electrode connected to the drain electrode of the one driving transistor and the drain electrode of the third transistor, a drain electrode connected to the light-emitting element, and a gate electrode connected to the emission signal line; and
   a fifth transistor including a source electrode connected to an on-bias stress line, a drain electrode connected to the source electrode of the one driving transistor at the first node, and a gate electrode connected to a third scan line.

12. The display device of claim 11, wherein an on-bias stress voltage supplied by the on-bias stress line is lower than a high potential power supply voltage supplied by the high potential power supply line.

13. The display device of claim 11, wherein the shielding layer is disposed to overlap the first node.

14. The display device of claim 11, wherein the shielding layer is connected to the on-bias stress line to reduce a variation in voltages of the first node and the second node due to voltage changes of the plurality of data link lines.

* * * * *